United States Patent
Yajima

(10) Patent No.: US 7,046,226 B2
(45) Date of Patent: May 16, 2006

(54) SEMICONDUCTOR INTEGRATED CIRCUIT

(75) Inventor: Hidehiko Yajima, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 370 days.

(21) Appl. No.: 10/443,966

(22) Filed: May 23, 2003

(65) Prior Publication Data

US 2004/0032292 A1 Feb. 19, 2004

(30) Foreign Application Priority Data

May 28, 2002 (JP) ............................. 2002-153672

(51) Int. Cl.
*G09G 3/36* (2006.01)
(52) U.S. Cl. ........................................ 345/98; 345/100
(58) Field of Classification Search ................. 345/98, 345/100
See application file for complete search history.

(56) References Cited

U.S. PATENT DOCUMENTS

| | | | |
|---|---|---|---|
| 5,894,296 A * | 4/1999 | Maekawa | 345/98 |
| 6,104,370 A * | 8/2000 | Nakagaki et al. | 345/100 |
| 6,184,855 B1 * | 2/2001 | Kobayashi et al. | 345/100 |
| 6,437,775 B1 * | 8/2002 | Hanari | 345/204 |
| 6,756,960 B1 * | 6/2004 | Miyatake | 345/98 |

FOREIGN PATENT DOCUMENTS

| | | |
|---|---|---|
| JP | A 4-176098 | 6/1992 |
| JP | A 5-35219 | 2/1993 |
| JP | A 8-6525 | 1/1996 |
| JP | A 11-38945 | 2/1999 |
| JP | A 2001-134240 | 5/2001 |

* cited by examiner

*Primary Examiner*—Xiao Wu
*Assistant Examiner*—M. Fatahiyar
(74) *Attorney, Agent, or Firm*—Oliff & Berridge, PLC

(57) ABSTRACT

The invention provides a semiconductor integrated circuit that can be used as either a segment driver or a common driver, where the number of wires for scanning data is reduced so that the area of the wiring is reduced and the layout is simplified. The semiconductor integrated circuit includes: a plurality of data holding devices that each hold data that is inputted via a first terminal and output the data to a second terminal or hold data that is inputted via the second terminal and output the data to the first terminal in response to the operating mode and the scanning direction; a switching device that switches the connections of the plurality of data holding devices in response to the operating mode; and a plurality of selecting devices that select one out of data outputted from the terminals of the plurality of data holding devices and data outputted from the terminals of the plurality of data holding devices in response to the operating mode and the scanning direction.

6 Claims, 6 Drawing Sheets

Related Art

SEMICONDUCTOR INTEGRATED CIRCUIT

BACKGROUND OF THE INVENTION

1. Field of Invention

The present invention relates to a semiconductor integrated circuit ("driver IC") to drive an image display apparatus, such as a liquid crystal panel.

2. Description of Related Art

FIG. 5 is a schematic that shows a related art driver IC to drive a liquid crystal panel. In FIG. 5, a plurality of output terminals of a segment driver 102 to output display signals S0 to S15 are connected, via a wiring pattern formed on a substrate 100, to a plurality of electrodes that are aligned in the segment direction on a liquid crystal panel 104. A plurality of output terminals of a common driver 101 to output the scanning signals C0 to C15 are also connected via a wiring pattern formed on the substrate 100 to a plurality of electrodes that are aligned in the common direction on the liquid crystal panel 104.

The common driver 101 and the segment driver 102 are connected to an MPU (Micro Processing Unit) 105. A RAM (Random Access Memory) 103 that is connected to the MPU 105 temporarily stores image data. The MPU 105 generates the display signals S0 to S15 based on the image data stored in the RAM 103 and supplies such signals to the segment driver 102. Based on these signals, the segment driver 102 simultaneously supplies the display signals S0 to S15 to the plurality of electrodes that are aligned in the segment direction on the liquid crystal panel 104. The MPU 105 also generates the scanning signals C0 to C15 based on the image data stored in the RAM 103 and supplies such signals to the common driver 101. Based on these signals, the common driver 101 successively supplies the scanning signals C0 to C15 to the plurality of electrodes that are aligned in the common direction on the liquid crystal panel 104 and so scans the liquid crystal panel 104.

In the related art, separate dedicated ICs are used as the segment driver and the common driver. However, in order to reduce the number of types of ICs, it would be conceivably possible to use the same type of IC commonly used as the segment driver and the common driver.

FIG. 6 is a schematic that shows a driver IC that can be used as either of the segment driver and the common driver. As shown in FIG. 6, this driver IC includes latch circuits 106 that latch display data that is inputted from the MPU via a display data bus, data I/O control circuits 107 and 108 that input or output scanning data that has been generated by the MPU, switches 109 and 110 that switch the driver IC between being operated as a segment driver and being operated as a common driver, switches 111 and 112 that switch the scanning direction during operating the driver IC as a common driver, and a first to $N^{th}$ DFFs (Delay Flip Flops) 113 that hold data in synchronization with an LP (line pulse) signal.

When operating the driver IC as a segment driver (hereinafter "segment mode"), the SC signal is always at a high level so that the switches 109 are always on state and the SC bar signal is always at a low level, so that the switches 110 are always in an off state. This means that the first to $N^{th}$ DFFs 113 hold the display data latched by the latch circuit 106 in synchronization with the LP signal, so that the held display data is simultaneously supplied to the output terminals $O_1$ to $O_N$.

On the other hand, when operating the driver IC as a common driver (hereinafter "common mode"), the SC signal is always at the low level so that the switches 109 are always in an off state and the SC bar signal is always at the high level, so that the switches 110 are always in an on state. In the common mode, it is also possible to switch the scanning direction by disposing the driver IC on the left side of the liquid crystal panel or on the right side of the liquid crystal panel. In a case where the scanning data supplied to the data I/O control circuit 107 is outputted from the data I/O control circuit 107 and returned to the data I/O control circuit 108, the SHL signal is at the high level, so that the switches 111 are turned on and the SHL bar signal is at the low level, so that the switches 112 are turned off. This means that in synchronization with a pulse of the LP signal, the first DFF 113 holds the scanning data outputted by the data I/O control circuit 107 and outputs the held scanning data to the output terminal $O_1$ and the second DFF 113. In synchronization with the next pulse of the LP signal, the second DFF 113 holds the scanning data outputted by the first DFF 113 and outputs the held scanning data to the output terminal $O_2$ and the next DFF 113. By repeating this operation, the scanning data is successively outputted to the output terminals $O_1$ to $O_N$.

Also, in the common mode, in a case where the scanning data supplied to the data I/O control circuit 108 is outputted from the data I/O control circuit 108 and returned to the data I/O control circuit 107, the SHL signal is at the low level so that the switches 111 are turned off and the SHL bar signal is at the high level, so that the switches 112 are turned on. This means that the $N^{th}$ DFF 113 holds the scanning data outputted by the data I/O control circuit 108 in synchronization with a pulse of the LP signal and outputs the held scanning data to the output terminal $O_N$ and the $(N-1)^{th}$ DFF 113. The $(N-1)^{th}$ DFF 113 holds the scanning data outputted by the $N^{th}$ DFF 113 in synchronization with the next pulse of the LP signal and outputs the held scanning data to the output terminal $O_{N-1}$ and the next DFF 113. By repeating this operation, the scanning data is successively outputted to the output terminals $O_N$ to $O_1$.

In this way, it is possible to design a driver IC that can be used as either a segment driver or a common driver. However, since there is a long distance between the output terminals $O_1$ to $O_N$, there has been the problem that it is necessary to use two long wiring routes for inputting and outputting the scanning data between the data I/O control circuit 107 and the first DFF 113 and between the $N^{th}$ DFF 113 and the data I/O control circuit 108.

SUMMARY OF THE INVENTION

In view of the above and/or other points, the present invention provides a semiconductor integrated circuit that can be used as either a segment driver or a common driver. The semiconductor integrated circuit has a reduced number of wires for scanning data so that the area of the wiring is reduced and the layout is simplified.

In order to address or achieve the above, a first aspect of the present invention is a semiconductor integrated circuit that can be used in a first operating mode to simultaneously supply display data to a plurality of electrodes arranged in a first direction on an image display apparatus that displays a two-dimensional image and in a second operating mode to successively supply scanning data in a positive or negative scanning direction to a plurality of electrodes arranged in a second direction that is perpendicular to the first direction. The semiconductor integrated circuit includes: a plurality of data holding devices that each either hold data that has been inputted via a first terminal and output the data to a second terminal or hold data that has been inputted via the second terminal and output the data to the first terminal, in response to an operating mode and a scanning direction; a switching device to switch connections of the plurality of data holding devices so that in the first operating mode display data is simultaneously supplied to each of the plurality of data holding devices and in the second mode scanning data that has been supplied to at least one data holding device out of the plurality of data holding devices is shifted by the plurality of data holding devices; and a plurality of selecting devices to select, in response to the operating mode and the scanning direction, one of data outputted from the first terminals of the plurality of data holding devices and data outputted from the second terminals of the plurality of data holding devices.

The above semiconductor integrated circuit may further include a data supply control device to control, in the second operating mode, whether the scanning data is supplied to one end or another end of a row of the plurality of data holding devices in accordance with the scanning direction.

A semiconductor integrated circuit according to a second aspect of the present invention successively supplies scanning data in a positive or a negative scanning direction to a plurality of electrodes that are arranged in a first direction on an image display apparatus that displays a two-dimensional image. The semiconductor integrated circuit includes: a plurality of data holding devices that each either hold data that has been inputted via a first terminal and output the data to a second terminal or hold data that has been inputted via the second terminal and output the data to the first terminal, in response to a scanning direction; and a plurality of selecting devices to select, in response to the scanning direction, one of data outputted from the first terminals of the plurality of data holding devices and data outputted from the second terminals of the plurality of data holding devices.

The above semiconductor integrated circuit may further include a data supply control device to control whether the scanning data is supplied to one end or another end of a row of the plurality of data holding devices in accordance with the scanning direction.

In any of the above semiconductor integrated circuits, each of the plurality of data holding devices may include a bi-directional flip flop that holds data that has been inputted via the first terminal or the second terminal in synchronization with a pulse signal inputted via a third terminal.

With the above construction, the number of wires for scanning data is reduced by using data holding devices that operate in both directions, so that it is possible to provide a semiconductor integrated circuit where the area of the wiring is reduced and layout is simplified.

DETAILED DESCRIPTION OF PREFERRED EMBODIMENTS

Figure 1:
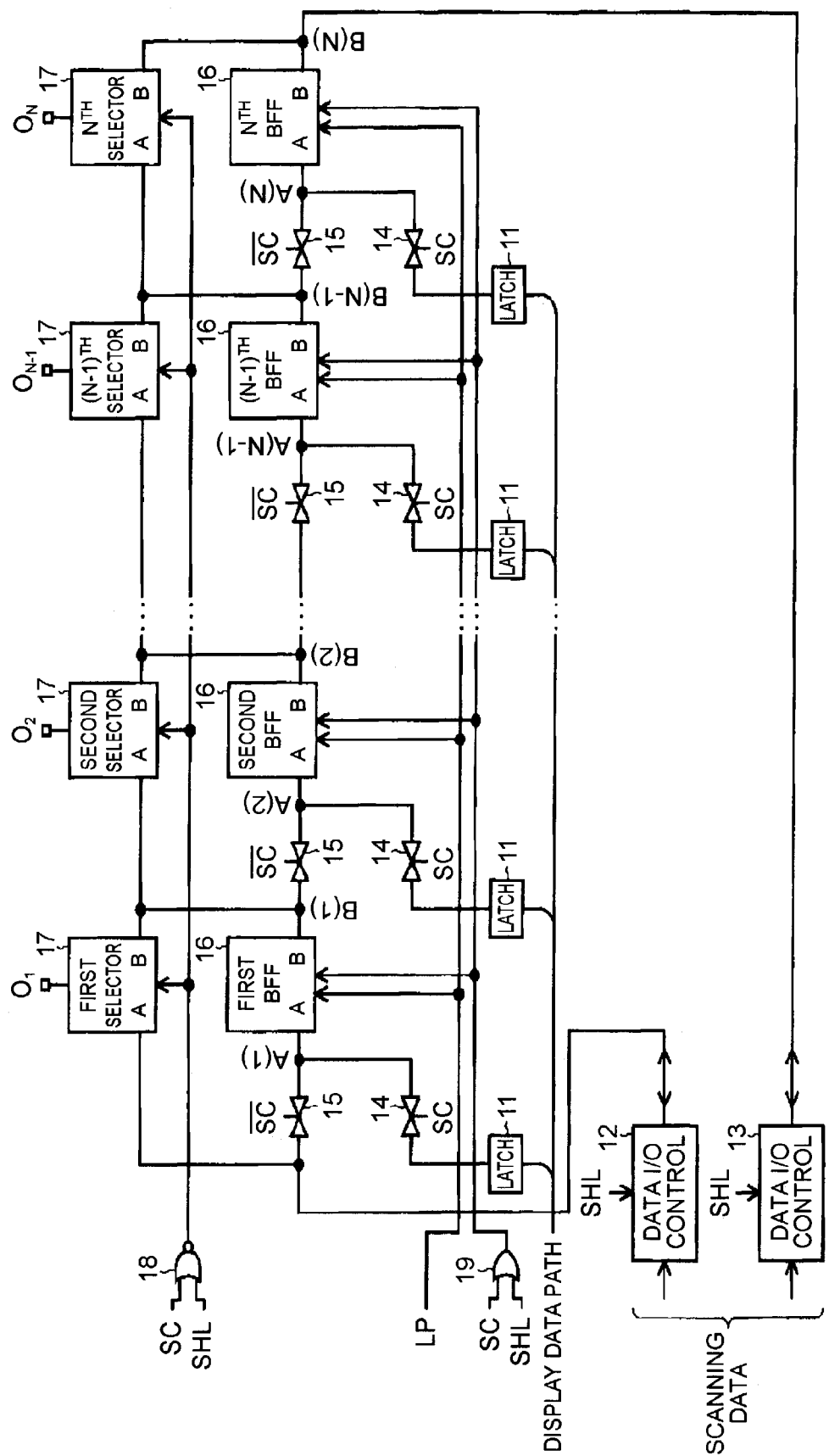
FIG. 1 is a schematic that shows a semiconductor integrated circuit according to an exemplary embodiment of the present invention.

The following describes an exemplary embodiment of the present invention with reference to the attached drawings. Components that are the same have been assigned the same reference numerals and description of such has been omitted.

FIG. 1 is a schematic that shows a semiconductor integrated circuit in response to the exemplary embodiment of the present invention. In this exemplary embodiment, the present invention is applied to a driver IC that drives a liquid crystal panel and can be used as either a segment driver or a common driver.

As shown in FIG. 1, the present driver IC includes latch circuits 11 that latch display data inputted from an MPU via a display data bus, data I/O control circuits 12 and 13 that input or output scanning data that has been generated by the MPU, switches 14 and 15 that switch the driver IC between operating as a segment driver and operating as a common driver, first to $N^{th}$ BFFs (Bi-directional Flip Flops) 16 that hold data in synchronization with an LP (Line Pulse) signal, first to $N^{th}$ selectors 17 that each select data inputted into one of terminal A and terminal B and supply the selected data to the output terminals $O_1$ to $O_N$, an inverting input NOR circuit 18 that supplies a control signal to the first to $N^{th}$ selectors 17, and an OR circuit 19 that supplies a control signal to the first to $N^{th}$ BFFs 16.

When the driver IC is being operated as a segment driver ("segment mode"), an SC signal is always at a high level and an SC bar signal is always at a low level. This means that the switches 14 are always on state and the switches 15 are always off state. At this point, an output signal of the NOR circuit 18 is always at a low level, so that each selector 17 selects the data inputted into the terminal B. Also, an output signal of the OR circuit 19 is always at the high level, so that the first to $N^{th}$ BFFs 16 each hold the data inputted into the terminal A and output this data from the terminal B. By so doing, the first to $N^{th}$ BFFs 16 hold the display data latched by the latch circuits 11 in synchronization with the LP signal and the held display data is simultaneously outputted to the output terminals $O_1$ to $O_N$ via the first to $N^{th}$ selectors 17.

Figure 2:
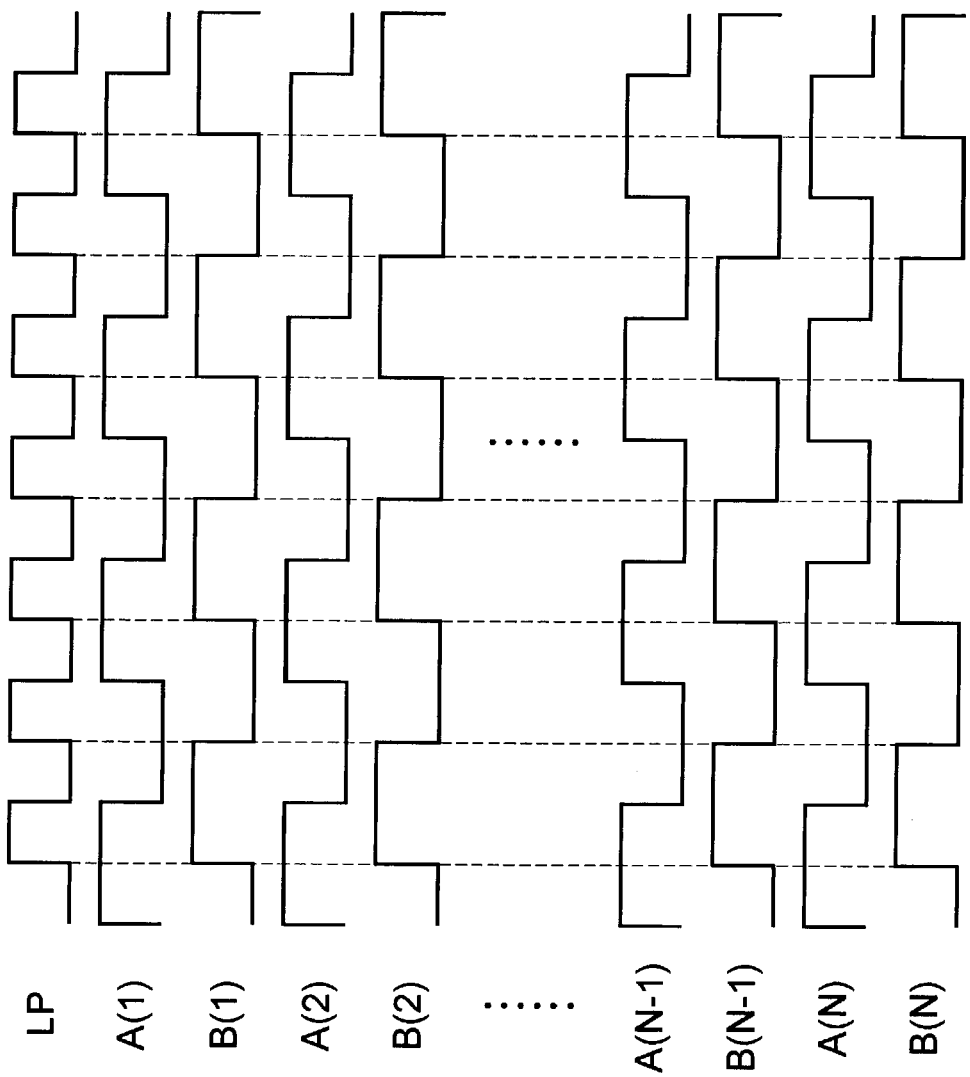
FIG. 2 is a timing chart showing the operation of each part in segment mode according to the exemplary embodiment of the present invention.

FIG. 2 is a timing chart showing the operation of each part in the segment mode. In the segment mode, the SC signal is always at the high level, so that the latch circuits 11 are always connected to the first to $N_{th}$ BFFs 16. This means that in synchronization with the LP signal, the first to $N_{th}$ BFFs 16 hold the display data supplied to the terminals A from the respective latch circuits 11 and simultaneously output the data from the terminals B to the first to $N^{th}$ selectors 17 as the data B(1) to B(N). In this way, by setting the SC signal at the high level, the driver IC of the present exemplary embodiment can be made to operate as a segment driver.

On the other hand, when the driver IC is being operated as a common driver (common mode"), the SC signal is always at the low level and the SC bar signal is always at the high level. This means that the switches 14 are always off state and the switches 15 are always on state. Also, in common mode, the scanning direction can be switched in response to whether the driver IC is disposed on the left side or on the right side of the liquid crystal panel. In a case where the scanning data supplied to the data I/O control circuit 12 is outputted from the data I/O control circuit 12 and returned to the data I/O control circuit 13, the SHL signal is set at the high level. By doing so, the level of output signal of the NOR circuit becomes the low level, so that the selectors 17 select the data inputted into the terminals B.

Since the output signal of the OR circuit 19 is at the high level, the first to $N^{th}$ BFFs 16 each output the data inputted into the terminal A from the terminal B. By doing so, in synchronization with a pulse of the LP signal, the first BFF 16 holds the scanning data outputted by the data I/O control circuit 12 and outputs the held scanning data to the output terminal $O_1$ and the second BFF 16. In synchronization with a next pulse of the LP signal, the second BFF 16 holds the scanning data outputted by the first BFF 16 and outputs the held scanning data to the output terminal $O_2$ and the next BFF 16. By repeating this operation, the scanning data is successively outputted from the output terminals $O_1$ to $O_N$.

Figure 3:
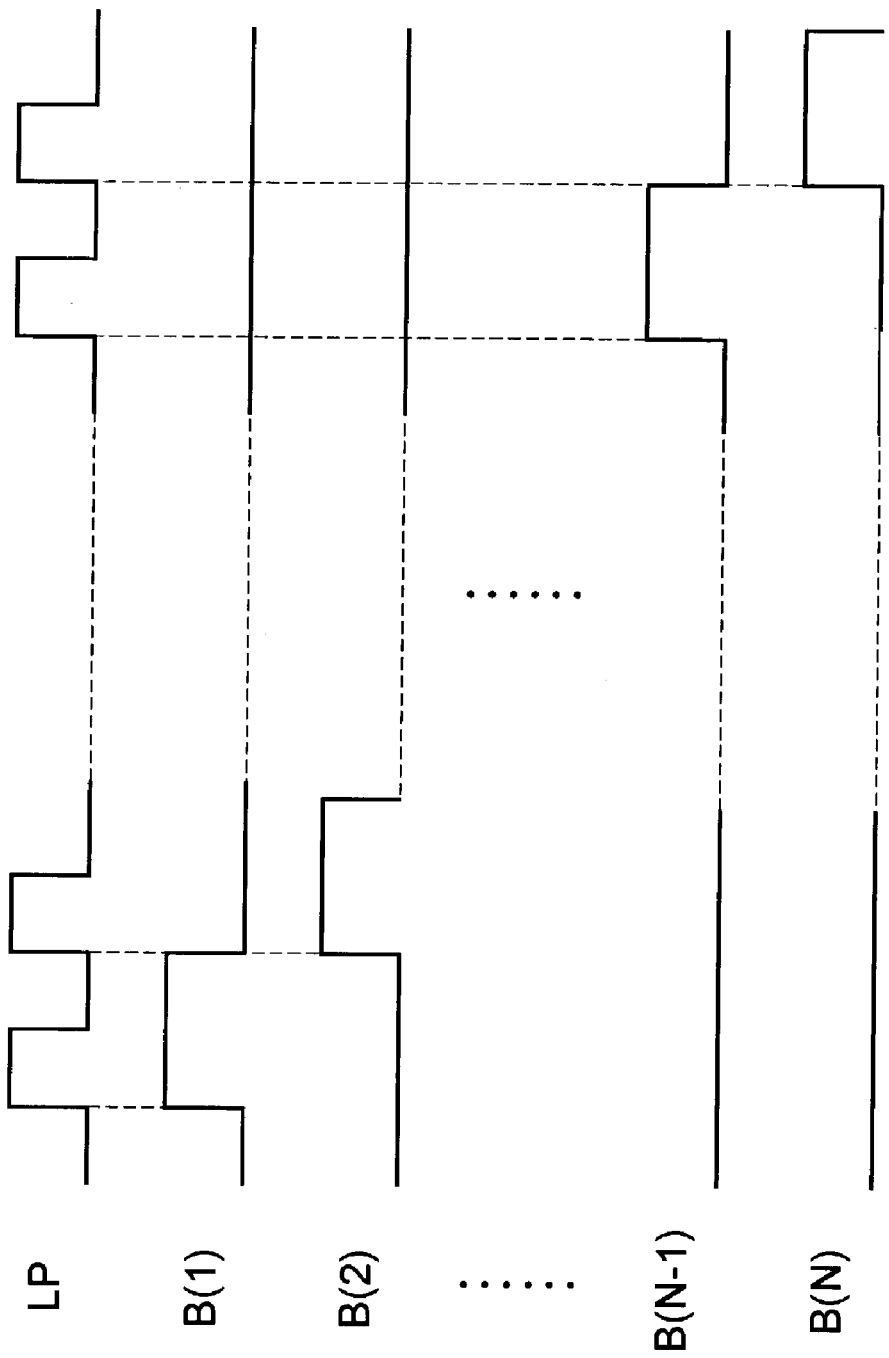
FIG. 3 is a timing chart showing the operation of each part when scanning in a first scanning direction in common mode, according to the exemplary embodiment of the present invention.

FIG. 3 is a timing chart showing the operation of each part when, in the common mode, the scanning data is outputted from the data I/O control circuit 12 and returned to the data I/O control circuit 13. In the common mode, the SC signal is always at the low level and by setting the SHL signal at the high level, the scanning data outputted from the data I/O control circuit 12 is returned to the data I/O control circuit 13 via the first BFF 16 to the $N^{th}$ BFF 16. In synchronization with the LP signal, the first BFF 16 to the $N^{th}$ BFF 16 shift the scanning data outputted from the data I/O control circuit 12 from the terminals A to the terminals B and successively output the scanning data from the terminals B to the first to $N^{th}$ selectors 17 as the data B(1) to B(N). In this way, by setting the SC signal at the low level and the SHL signal at the high level, the driver IC of the present exemplary embodiment can be made to operate as a common driver for a first scanning direction.

On the other hand, in the common mode, in a case where the scanning data that has been supplied to the data I/O control circuit 13 is outputted from the data I/O control circuit 13 and is returned to the data I/O control circuit 12, the SHL signal is set at the low level. By doing so, the level of the output signal of the NOR circuit 18 becomes low, so that the selectors 17 each select the data inputted into the terminals A.

Also, the level of the output signal of the OR circuit 19 becomes low, so that the first to $N^{th}$ BFFs 16 each output the data inputted into the terminals B from the terminals A. This means that, in synchronization with a pulse of the LP signal, the $N^{th}$ BFF 16 holds the scanning data outputted by the data I/O control circuit 13 and outputs the held scanning data to the output terminal $O_N$ and the $(N-1)^{th}$ BFF 16. In synchronization with the next pulse of the LP signal, the $(N-1)^{th}$ BFF 16 holds the scanning data outputted by the $N^{th}$ BFF 16 and outputs the held scanning data to the output terminal $O_{N-1}$ and the next BFF 16. By repeating this operation, the scanning data is successively outputted from the output terminals $O_N$ to $O_1$.

Figure 4:
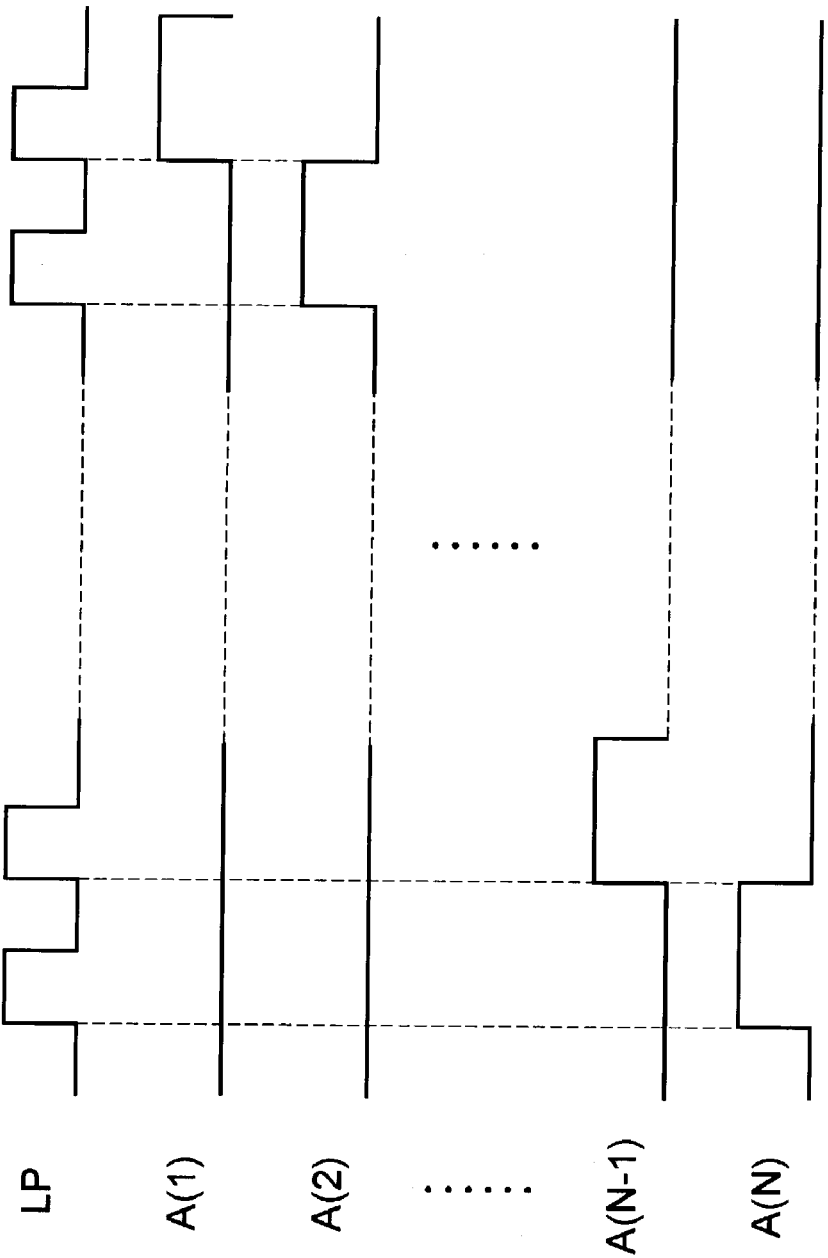
FIG. 4 is a timing chart showing the operation of each part when scanning in a second scanning direction in common mode, according to the exemplary embodiment of the present invention.
Figure 5:
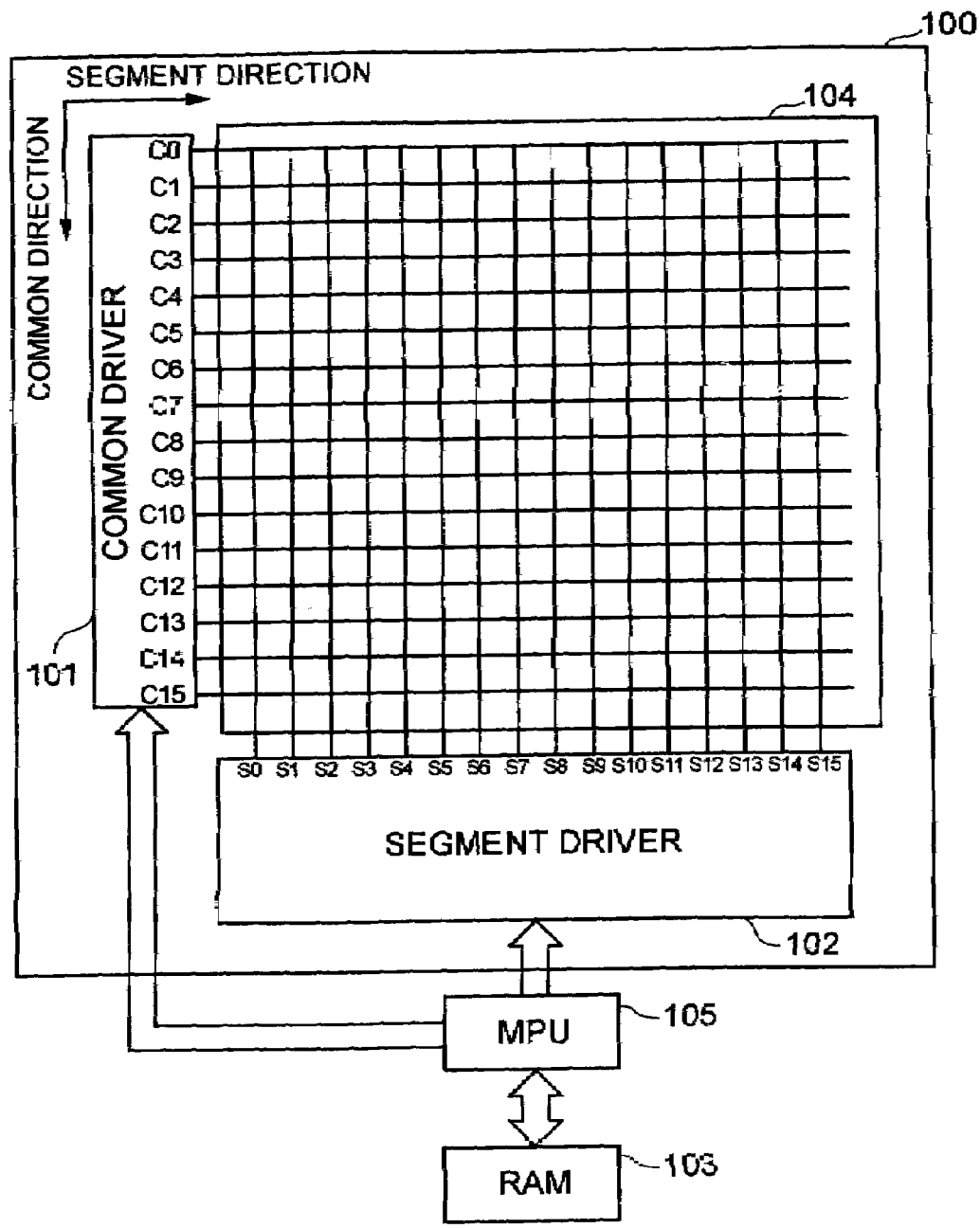
FIG. 5 is a schematic that shows a related art driver IC for a liquid crystal panel.
Figure 6:
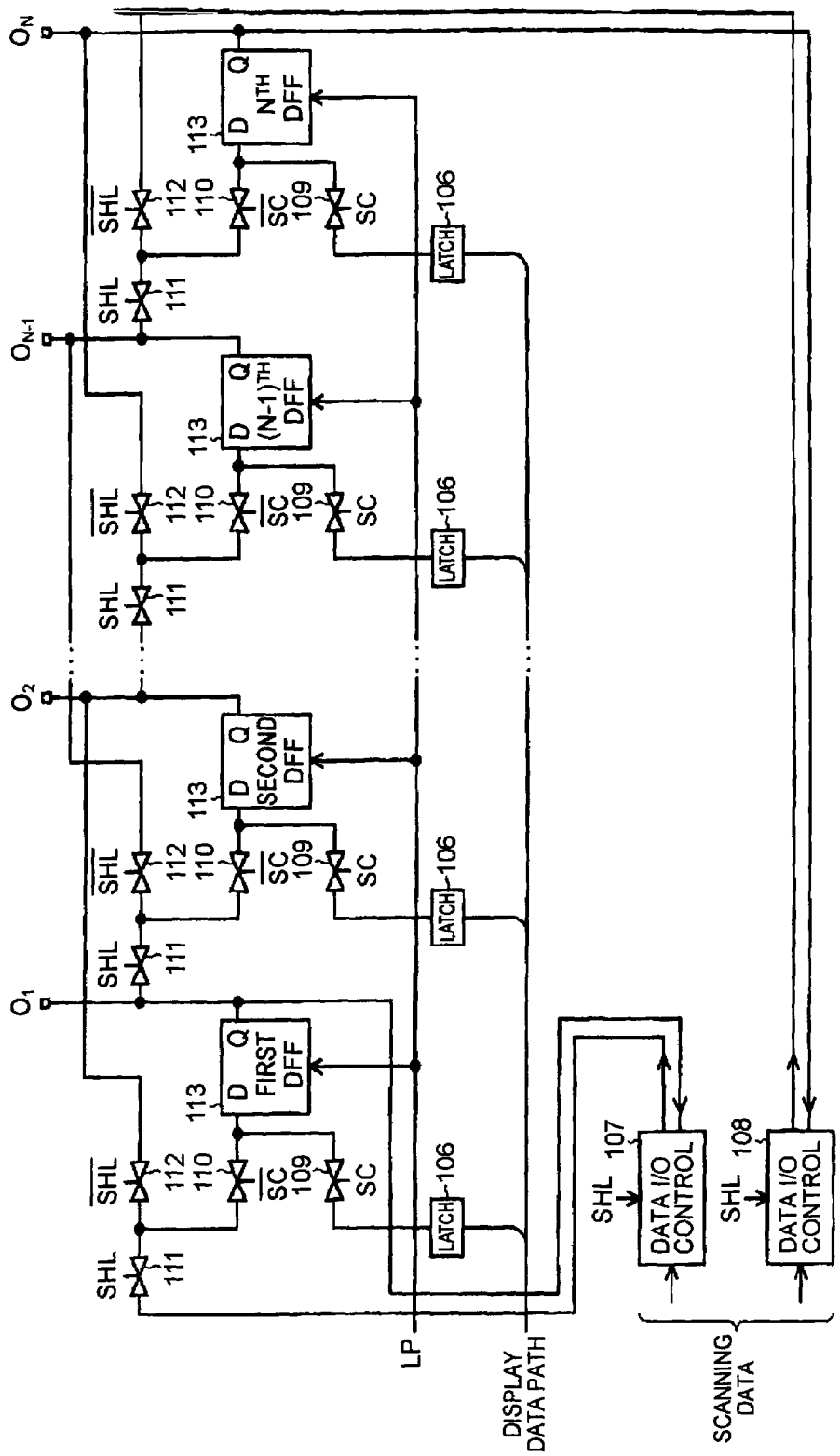
FIG. 6 is a schematic that shows a related art driver IC that can be used as either a segment driver or a common driver.

FIG. 4 is a timing chart showing the operation of each part when, in the common mode, the scanning data is outputted from the data I/O control circuit 13 and returned to the data I/O control circuit 12. In the common mode, the SC signal is always at the low level and by setting the SHL signal at the low level, the scanning data outputted from the data I/O control circuit 13 is returned to the data I/O control circuit 12 via the $N^{th}$ BFF 16 to the first BFF 16. In synchronization with the LP signal, the $N^{th}$ BFF 16 to the first BFF 16 shift the scanning data outputted from the data I/O control circuit 13 from the terminals B to the terminals A and successively output the scanning data from the terminals A to the first to $N^{th}$ selectors 17 as the data A(1) to A(N). In this way, by setting the SC signal at the low level and the SHL signal at the low level, the driver IC of the present exemplary embodiment can be made to operate as a common driver for a second scanning direction.

While a driver IC that can be used as either a segment driver or a common driver is described in the present exemplary embodiment, the present invention can be applied to a dedicated common driver.

As described above, according to the present invention, it is possible to realize a semiconductor integrated circuit where the number of wires for scanning data is reduced so that the area of the wiring is reduced and the layout is simplified. The input and output positions of the scanning data for the flip flops are the same, so that there is no need to provide wires that extend from midpoints in the row of flip flops, which makes the layout even simpler.

What is claimed is:

1. A semiconductor integrated circuit that can be used in a first operating mode to simultaneously supply display data to a plurality of electrodes arranged in a first direction on an image display apparatus that displays a two-dimensional image, and in a second operating mode to successively supply scanning data in a positive or negative scanning direction to a plurality of electrodes arranged in a second direction that is orthogonal with the first direction, the semiconductor integrated circuit comprising:
   a plurality of data holding devices that each either hold data inputted via a first terminal and output the data to a second terminal, or hold data inputted via the second terminal and output the data to the first terminal, in response to an operating mode and a scanning direction;
   a switching device that switches connections of the plurality of data holding devices so that display data is simultaneously supplied to each of the plurality of data holding devices in the first operating mode and scanning data that has been supplied to at least one of the plurality of data holding devices is shifted by the plurality of data holding devices in the second mode; and
   a plurality of selecting devices to select one of data outputted from the first terminals of the plurality of data holding devices and data outputted from the second terminals of the plurality of data holding devices in response to the operating mode and the scanning direction.

2. The semiconductor integrated circuit according to claim 1, further comprising a data supply control device to control, in the second operating mode, whether the scanning data is supplied to one end or another end of a row of the plurality of data holding devices in response to the scanning direction.

3. A semiconductor integrated circuit that successively supplies scanning data in a positive or a negative scanning direction to a plurality of electrodes that are arranged in a first direction on an image display apparatus that displays a two-dimensional image, the semiconductor integrated circuit comprising:
   a plurality of data holding devices that each either hold data inputted via a first terminal and output the data to a second terminal, or hold data inputted via the second terminal and output the data to the first terminal, in response to an operating mode and a scanning direction; and
   a plurality of selecting devices that select, in response to the operating mode and the scanning direction, one of data outputted from the first terminals of the plurality of data holding devices and data outputted from the second terminals of the plurality of data holding devices.

4. The semiconductor integrated circuit according to claim 3, further comprising a data supply control device to control whether the scanning data is supplied to one end or another end of a row of the plurality of data holding devices in response to the scanning direction.

5. The semiconductor integrated circuit according to claim 1, each of the plurality of data holding devices including a bi-directional flip flop that holds data inputted via the first terminal or the second terminal in synchronization with a pulse signal inputted via a third terminal.

6. The semiconductor integrated circuit according to claim 3, each of the plurality of data holding devices including a bi-directional flip flop that holds data inputted via the first terminal or the second terminal in synchronization with a pulse signal inputted via a third terminal.

* * * * *